(12) United States Patent
Iwasaki

(10) Patent No.: US 7,005,918 B2
(45) Date of Patent: Feb. 28, 2006

(54) CURRENT-TO-VOLTAGE CONVERTING APPARATUS AND IMPEDANCE MEASURING APPARATUS

(75) Inventor: Yukoh Iwasaki, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 102 days.

(21) Appl. No.: 10/809,262

(22) Filed: Mar. 25, 2004

(65) Prior Publication Data

US 2004/0212374 A1   Oct. 28, 2004

(30) Foreign Application Priority Data

Apr. 18, 2003   (JP) .............................. 2003-113733

(51) Int. Cl.
*H03F 1/36* (2006.01)
(52) U.S. Cl. .......................... 330/107; 330/2; 324/601; 324/650
(58) Field of Classification Search ................ 330/107, 330/2, 9, 85, 86, 109; 327/560; 324/601, 324/602, 548, 649, 650, 658, 672, 686, 76, 324/77
See application file for complete search history.

(56) References Cited

U.S. PATENT DOCUMENTS 6,054,867 A       4/2000  Wakamatsu ................. 324/650
2002/0079959 A1 *  6/2002  Nair et al. ..................... 330/9

FOREIGN PATENT DOCUMENTS

JP       03-061863        3/1991

* cited by examiner

*Primary Examiner*—Michael B Shingleton

(57) ABSTRACT

A current-to-voltage converting apparatus connected to an element or a circuit having a first terminal connected to a signal source and comprising a feedback amplifier, which is connected to a second terminal of the element or the circuit and keeps the second terminal at virtual ground, and which converts the current signals that flow to the element or the circuit to voltage signals and outputs these signals; a device for opening the feedback loop of the feedback amplifier and measuring the open-loop loss of the feedback loop; and a compensating amplifier, which compensates for the open-loop loss. It further comprises a device for measuring the open-loop phase shift of the feedback loop when the feedback loop is open and a control unit for keeping the open-loop phase shift at a pre-determined value.

18 Claims, 3 Drawing Sheets

| S10 |
|---|
| Initialization |

↓

| S20 |
|---|
| Output of adjustment signals and determination |

↓

| S30 |
|---|
| Determination of adjustment signals that have made one negative feedback loop |

↓

| S40 |
|---|
| Calculation of open-loop loss and compensation of the loss Calculation of open-loop phase shift and control of the phase shift |

↓

| S50 |
|---|
| Impedance measurement |

↓

| S60 |
|---|
| Output |

CURRENT-TO-VOLTAGE CONVERTING APPARATUS AND IMPEDANCE MEASURING APPARATUS

BACKGROUND OF THE INVENTION

1. Field of the Invention

The present invention pertains to an impedance measuring apparatus and in particular, relates to an impedance measuring apparatus with which high-speed measurement is possible.

2. Background of the Art

Impedance measuring apparatuses that operate by the automatic balanced-bridge method are an example of the prior art of impedance measuring apparatuses. Impedance measuring apparatuses that operate by the automatic balanced-bridge method are characterized in that they cover a broad measurement frequency range and their measurement accuracy is good within a broad impedance measurement range.

The internal structure and operation of an impedance apparatus that operates by the automatic balanced-bridge method are described below. FIG. 1 is a drawing showing the internal structure of an impedance measuring apparatus that operates by the automatic balanced-bridge method. Impedance measuring apparatus 10 in FIG. 1 comprises signal source 200, current-to-voltage converting apparatus 300, and vector voltmeter 400 for determining the impedance of device under test 100. The entire impedance measuring apparatus 10 is operated under the control of an operation control device $CTRL_1$ (not illustrated), such as a CPU.

Device under test 100 is an element or a circuit having two terminals. Device under test 100 should have at least two terminals and also, it can be an element or a circuit with three or more terminals. In this case, two of the three or more terminals are used for the measurements. Device under test 100 is represented by "DUT" in FIG. 1. The point where device under test 100, cable 510, and cable 520 are connected in FIG. 1 is referred to as the High terminal. Moreover, the point where device under test 100, cable 530, and cable 540 are connected is referred to as the Low terminal.

Signal source 200 is the signal source that is connected to a first terminal of the device under test 100 by cable 510 and generates measurement signals that are applied to device under test 100. Moreover, signal source 200 is also connected to vector voltmeter 400 by cable 510, cable 520, and buffer 550 and feeds measurement signals to vector voltmeter 400. The measurement signals are single sine-wave signals. However, the measurement signals are not limited to single sine-wave signals and can also be signals that comprise several sine waves.

Current-to-voltage converting apparatus 300 converts the current that flows to device under test 100 and outputs voltage signals to buffer 560. Current-to-voltage converting apparatus 300 comprises a null detector 310, a narrow-band amplifier 600, a buffer 320, and a range resistor 330. Cable 530, null detector 310, narrow-band amplifier 600, buffer 320, range resistor 330, and cable 540 form a negative feedback loop 340.

Null detector 310 balances the current that flows to range resistor 330 and the current that flows to device under test 100 and outputs signals to narrow-band amplifier 600 such that the current that flows into the input terminals of null detector 310 through cable 530 will be brought to zero. When the current that flows to range resistor 330 and the current that flows to device under test 100 are balanced, the current at the Low terminal is kept at virtual ground.

FIG. 2 is a drawing showing the internal structure of narrow-band amplifier 600. Narrow-band amplifier 600 comprises a phase sensitive detector 610, a filter 620 and a filter 630, as well as a vector modulator 640, and amplifiers and amplifies the output signals of null detector 310 and outputs them to buffer 320. Narrow-band amplifier 600 resolves the output signals of null detector 310 into an in-phase component and an quadrature-phase component using phase sensitive detector 610, filters the in-phase component and quadrature-phase component using filter 620 and filter 630, modulates the filtered in-phase component and quadrature-phase component using vector modulator 640, and feeds the vector-modulated voltage signals to buffer 320.

Phase sensitive detector 610 is a quadrature detector and comprises a mixer 611, a mixer 612, a signal source 613, and a signal source 614. Signal source 613 generates sine-wave signals and feeds them to mixer 611. Moreover, signal source 614 generates cosine-wave signals and feeds them to mixer 612. The sine-wave signals output by signal source 613 and the cosine signals output by signal source 614 have the same frequency as the measurement signals and they are orthogonal to each other. Consequently, mixer 611 and mixer 612 can orthogonally resolve the output signal of null detector 310 into an in-phase component and an quadrature-phase component.

Filter 620 is an integrator that comprises a resistor 621, an amplifier 622, and a capacitor 623, and integrates the output signals of mixer 611. Filter 630 is an integrator comprising a resistor 631, an amplifier 632, and a capacitor 633, and integrates the output signals of mixer 612.

Vector modulator 640 comprises a mixer 641, a mixer 642, a signal source 643, a signal source 644, and an adder 645. Signal source 643 generates sine-wave signals and feeds them to mixer 641. Moreover, signal source 644 generates cosine signals and feeds them to mixer 642. The sine-wave signals output by signal source 643 and the cosine-wave signals output by signal source 644 have the same frequency as the measurement signals, and they are orthogonal to each other. Mixer 641 modulates the sine-wave signals that are output from signal source 643 with the output signals of filter 620 and outputs the modulated sine signal. Mixer 642 modulates the cosine-wave signals output from signal source 644 with the output signals of filter 630 and outputs the modulated cosine signal. The voltage signals output from mixer 641 and the voltage signals output from mixer 642 are added by adder 645 and output to buffer 320.

Vector voltmeter 400 of FIG. 1 measures output signal $E_{dut}$ of buffer 550 and output signal $E_{rr}$ of buffer 560. Control device $CTRL_1$ calculates the vector ratio of signal $E_{dut}$ and signal $E_{rr}$ that have been measured and calculates the impedance of device under test 100 from the calculated vector ratio and the resistance of range resistor 330.

Measurement of the gate oxide film is one important measurement in the production of MOS devices. The gate oxide film thickness is an important parameter in determining the operating threshold of MOS-type devices. The gate oxide film thickness is measured by measuring the impedance of an MOS device, calculating the capacitance from the impedance measurement, and converting this calculated capacitance to the equivalent oxide film thickness using the dielectric constant.

When an MOS device on a semiconductor wafer is tested using a conventional impedance measuring apparatus 10, a wafer interface device comprising a switch matrix, a chuck, a probe card, and the like is added between the impedance measuring apparatus 10 and device under test 100. The wafer interface device has a larger ground capacitance than device under test 100. Moreover, cable 510, cable 520, cable 530, and cable 540 that are connected between this wafer interface device and impedance measuring apparatus 10 are relatively long and also have a large ground capacitance. Cable 510, cable 520, cable 530, and cable 540 are called cable 510, etc., hereafter. FIG. 3 is a drawing in which the above-mentioned ground capacitance has been added to FIG. 1. $C_{cable}$ in FIG. 3 is the total ground capacitance of cable 510, etc. Moreover, $C_{winf}$ is the ground capacitance of the wafer interface device. The ground capacitance of the wafer interface device comprises the ground capacitance of the switch matrix, the ground capacitance of the chuck, and the ground capacitance of the probe card.

Conventional impedance measuring apparatus has two problems with high-speed measurements. The first problem is that when a large ground capacitance is applied to the Low terminal, the current-to-voltage converting apparatus 300 takes a long time to settle. If the time to settling of the current-to-voltage converting apparatus 300 is long, the time until the current that flows to range resistor 330 and the current that flows to the device under test are balanced is also long and the wait time until measurements begin is increased. When the capacitance of an MOS device on a semiconductor wafer is measured, this problem is exacerbated by a wafer interface device and cable 510, etc., with a large ground capacitance, as described above.

The second problem is that when the capacitance of an MOS device on a semiconductor wafer is measured, the ground capacitance of the wafer interface device and cable 510, etc. is not constant. There are many types of wafer interface devices and cable 510, etc. depending on the device under test and the user's selection. Consequently, the ground capacitance of the wafer interface device and cable 510, etc. is not constant. Unless the ground capacitance on the wafer interface device and cable 510, etc. is constant, it will be very difficult to keep the ground capacitance from affecting the measurement results as planned.

There has been considerable progress in microfabrication technology for semiconductors in recent years, with a huge number of elements or circuits being formed on one wafer. While there has been an obvious increase in the number of elements that serve as the device under test, a corresponding increase in measurement time is not allowed. Moreover, sacrifice of measurement precision for high-speed measurement is not acceptable. The realization of high-speed, high-precision impedance measurement is a very important problem in the semiconductor industry today.

SUMMARY OF THE INVENTION

The present invention provides a novel apparatus with which impedance can be measured at high speed and high precision in order to solve the above-mentioned problems.

The present invention was created in order to realize the above-mentioned object. The present invention is characterized in that it is a current-to-voltage converting apparatus connected to an element or a circuit having a first terminal connected to a signal source comprising a feedback amplifier, which is connected to a second terminal of this element or this circuit and keeps this second terminal at virtual ground, and converts current signals that flow to this element or this circuit to voltage signals and outputs these signals; means for opening the feedback loop of this feedback amplifier and measuring the open-loop loss of this feedback loop; and a compensating amplifier, which compensates for this open-loop loss.

Moreover, the present invention also provides an impedance measuring apparatus characterized in that it comprises a signal source connected to a first terminal of a device under test; a feedback amplifier, which is connected to a second terminal of this device under test and keeps this second terminal at virtual ground, and converts to voltage signals and outputs the current signals that flow to this device under test; means for opening the feedback loop of this feedback amplifier and measuring the open-loop loss of this feedback loop; a compensating amplifier, which compensates this open-loop loss; and means for measuring the vector voltage ratio between the voltage signals between this first terminal and this second terminal and the output signals of this feedback amplifier; and it measures the impedance of this device under test from this vector voltage ratio.

DETAILED DESCRIPTION OF THE PREFERRED EMBODIMENTS

Figure 1:
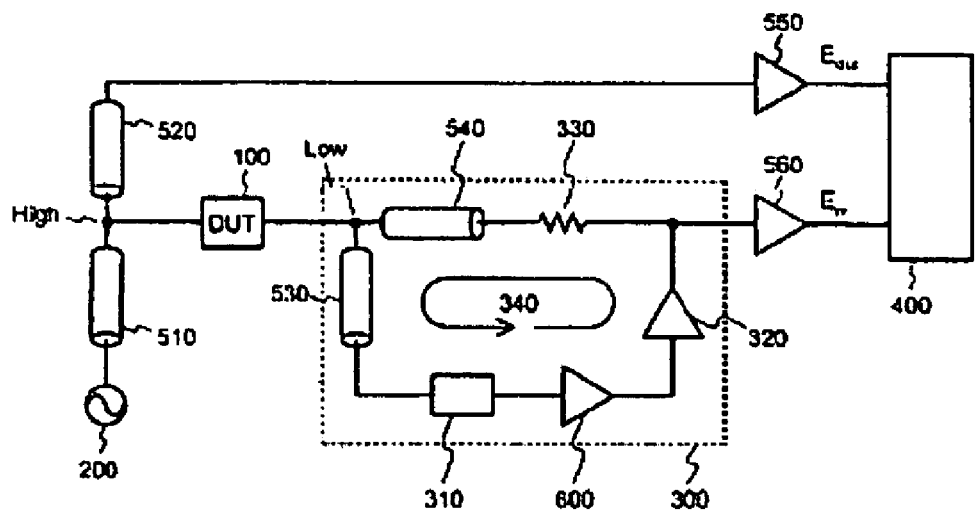
FIG. 1 is a drawing showing the internal structure of an impedance measuring apparatus of the prior art.
Figure 2:
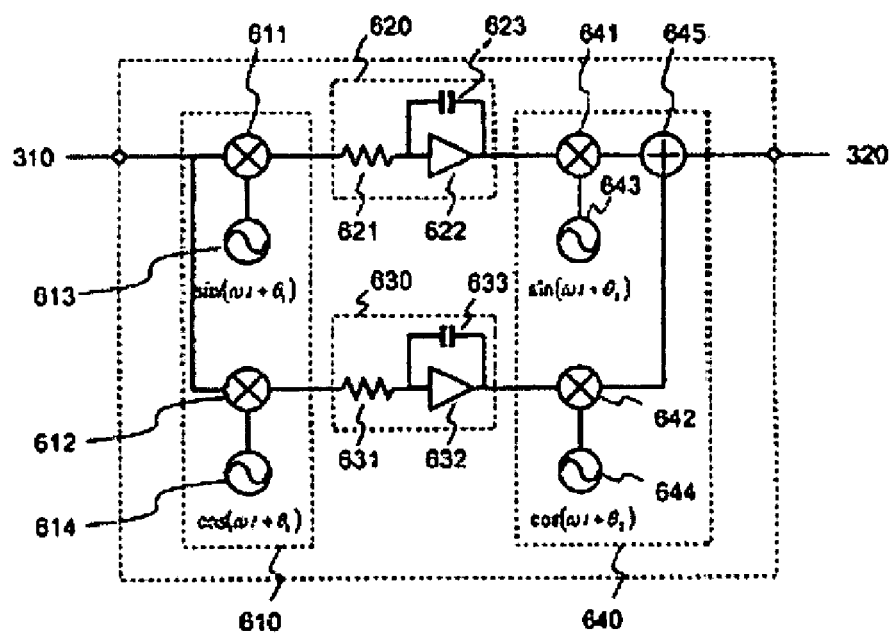
FIG. 2 is a drawing showing the internal structure of a narrow-band amplifier of an impedance measuring apparatus of the prior art.
Figure 3:
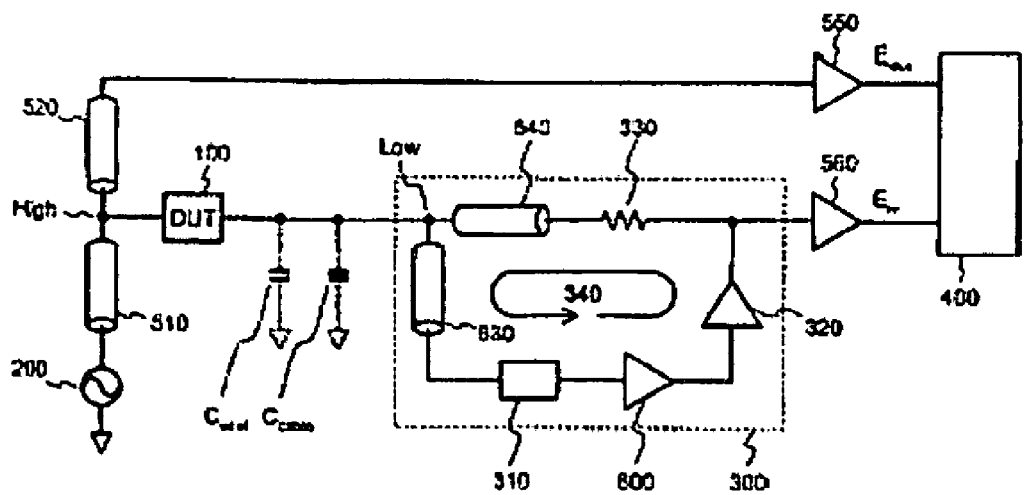
FIG. 3 is a drawing showing an impedance measuring apparatus of the prior art to which a wafer interface apparatus has been added.
Figure 4:
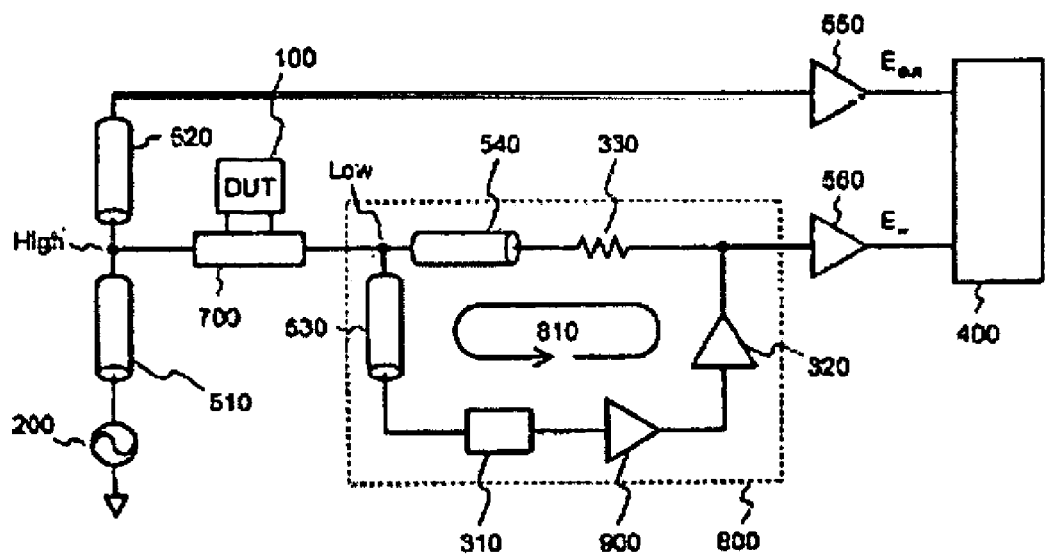
FIG. 4 is a drawing showing the internal structure of the impedance measuring apparatus of the present invention.

The present invention will now be described based on the preferred embodiments shown in the appended drawings. The first embodiment of the present invention is an impedance measuring apparatus that operates by the automatic balanced-bridge method, and its internal structure is shown in FIG. 4. The same reference symbols are used in FIGS. 1 and 4 for structural elements having the equivalent function and properties.

An impedance measuring apparatus 20 in FIG. 4 comprises a signal source 200, a current-to-voltage converting apparatus 800, and a vector voltmeter 400 for measuring the impedance of device under test 100. Impedance measuring apparatus 20 operates under the control of computer device $CTRL_2$ (not illustrated) that executes the programs.

Device under test 100 comprises multiple MOS devices on a semiconductor wafer. For convenience, the device under test is represented in the drawing as only one "DUT." The MOS capacitance of the MOS device is measured in the present embodiment and therefore, device under test 100 is a capacitor with a first terminal and a second terminal. Device under test 100 is connected to impedance measuring apparatus 20 through a wafer interface device 700. Although not illustrated, wafer interface device 700 comprises a switch matrix, a chuck, a probe card, and the like. The point where wafer interface device 700 and a cable 510 and a cable 520 are connected is referred to as the High terminal. Moreover, the point where wafer interface device 700 and cable 530 and a cable 540 are connected is referred to as the Low terminal. Device under test 100 should have at least two terminals and also can be an element or circuit with three or more terminals, such as a transistor. In this case, two of the three or more terminals are used in the measurements.

Signal source 200 is the signal source that is connected to the first terminal of device under test 100 via cable 510 and wafer interface device 700 and generates the measurement signals that will be applied to device under test 100. Moreover, signal source 200 is the signal source that is connected to vector voltmeter 400 through cable 510, cable 520, and buffer 550 and feeds the measurement signals to vector voltmeter 400. The measurement signals are single sine-wave signals. However, the measurement signals are not limited to single sine-wave signals and can also be signals that comprise multiple sine waves.

A current-to-voltage converting apparatus 800 converts current flowing to device under test 100 and outputs voltage signals to buffer 560. Current-to-voltage converting apparatus 800 comprises a null detector 310, a narrow-band amplifier 900, a buffer 320, and a range resistor 330. Cable 530, null detector 310, narrow-band amplifier 900, buffer 320, range resistor 330, and cable 540 form a negative feedback loop 810.

Null detector 310 balances the current that flows to range resistor 330 and the current that flows to device under test 100 and outputs signals to narrow-band amplifier 900 so that the current that flows through cable 530 to the input terminal of null detector 310 is brought to zero. When the current that flows to range resistor 330 and the current that flows to device under test 100 are balanced, the voltage of the Low terminal is kept at virtual ground.

Figures 5, 6:
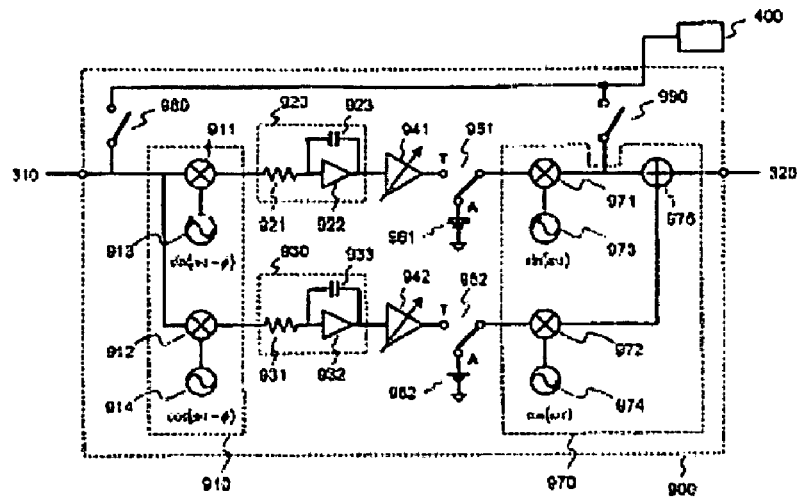
FIG. 5 is a drawing showing the internal structure of the narrow-band amplifier of the impedance measuring apparatus of the present invention.
FIG. 6 is a flow chart showing the operation of the impedance measuring apparatus of the present invention.

FIG. 5 is a drawing showing the internal structure of narrow-band amplifier 900. Narrow-band amplifier 900 comprises a phase sensitive detector 910, filters 920 and 930, a variable gain amplifier 941, a variable gain amplifier 942, a switch 951, a switch 952, a constant voltage source 961, a constant voltage source 962, a vector modulator 970, a switch 980, and a switch 990, and amplifies the output signals of null detector 310 and outputs them to buffer 320.

Phase sensitive detector 910 is quadrature detector and comprises a mixer 911, a mixer 912, a signal source 913, and a signal source 914. Signal source 913 generates sine-wave signals and feeds them to mixer 911. Moreover, signal source 914 generates cosine signals and feeds them to mixer 912. The sine-wave signals output by signal source 913 and the cosine-wave signals output by signal source 914 have the same frequency as the measurement signals and the signals are orthogonal to each other. Consequently, mixer 911 and mixer 912 orthogonally resolve the output signal of null detector 310 into an in-phase component and an quadrature-phase component and output the signals to filter 920 and filter 930. The output signal of signal source 913 and the output signal of signal source 914 should be signals that have the same frequency as the measurement signal and are orthogonal to each other, and they can be a rectangular-wave signal rather than a sine-wave signal.

Filter 920 is an integrator comprising a resistor 921, an amplifier 922, and a capacitor 923, and integrates the output signals of mixer 911. Moreover, filter 930 is an integrator comprising a resistor 931, an amplifier 932, and a capacitor 933, and integrates the output signals of mixer 912.

Variable gain amplifier 941 amplifies the output signals of filter 920 and outputs them to switch 951. Moreover, variable gain amplifier 942 amplifies the output signals of filter 930 and outputs them to switch 952. The gain of variable gain amplifier 941 and that of variable gain amplifier 942 are the same and the gain is changed by computer control $CTRL_2$.

Switch 951 selects either the output signals of variable gain amplifier 941 or the output signals of constant voltage source 961 and outputs these to vector modulator 970. Moreover, switch 952 selects either the output signals of variable gain amplifier 942 or the output signals of constant voltage source 962 and outputs them to vector modulator 970.

Vector modulator 970 comprises a mixer 971, a mixer 972, a signal source 973, a signal source 974, and an adder 975. Signal source 973 generates sine-wave signals and feeds them to mixer 971. Moreover, signal source 974 generates cosine-wave signals and feeds them to mixer 972. The sine-wave signals output by signal source 973 and the cosine-wave signals output by signal source 974 have the same frequency as the measurement signals and are orthogonal to each other. Mixer 971 modulates the sine-wave signals output from signal source 973 with the output signals of switch 951 and outputs the modulated sine signal. Mixer 972 modulates the cosine-wave signals output from signal source 974 with the output signals of switch 952 and outputs the modulated cosine signal. The voltage signals that are output from mixer 971 and the voltage signals that are output from mixer 972 are added by adder 975 and output to buffer 320. The output signals of signal source 973 and the output signals of signal source 974 should be signals having the same frequency as the measurement signals and that are orthogonal one another. They are not limited to sine-wave signals or cosine-wave signal. For instance, rectangular-wave signals can be used in place of these signals.

Switch 980 feeds the signals that will be input to phase sensitive detector 910 to vector voltmeter 400 as necessary. Moreover, switch 990 feeds the output signals of mixer 971 to vector voltmeter 400 as necessary.

Vector voltmeter 400 of FIG. 4 measures output signal $E_{dut}$ of buffer 550 and output signal $E_{rr}$ of buffer 560. Control device $CTRL_2$ calculates the vector ratio of measured signal $E_{dut}$ and signal $E_{rr}$ and further, calculates the impedance of device under test 100 from the calculated vector ratio and the resistance of range resistor 330. Although not illustrated, range resistor 330 comprises multiple resistors with different resistances and selects the resistor as needed in accordance with the impedance of device under test 100 that is to be measured. Impedance measuring apparatus 20 thereby can measure the impedance from a wide range of values.

Next, the operating procedure of impedance measuring apparatus 20 will be described. As previously explained, impedance measuring apparatus 20 is operated under the control of computer device $CTRL_2$ that executes the programs. Consequently, the following operating procedure describes the flow of the program executed by computer device $CTRL_2$. The flow chart that shows the operating procedure of impedance measuring apparatus 20 is shown in FIG. 6.

First, at step 10, impedance measuring apparatus 20 initializes the entire device. For instance, it performs voltage offset adjustment within the apparatus, and the like.

Next, at step 20, negative feedback loop 810 is opened, the adjustment signals for measuring the open-loop loss and the open-loop phase shift of the negative feedback loop are output and the adjustment signals (original signals) are measured. The open-loop loss and open-loop phase shift are the loss and the phase of the one-loop transmission function. Specifically, the output signals of signal source 200 become zero or direct current signals constant-voltage source 961 and mixer 971 are conducted with switch 951 as the A side and constant voltage source 962 and mixer 972 are conducted with switch 952 as the A side. When signal source 200 becomes either zero or a direct-current signal, the High terminal is grounded. Sine-wave signals are output from signal source 973. Zero or direct current signals are output from signal sources 974. The output signals of mixer 971 are used as the adjustment signals for this condition. Furthermore, switch 990 is turned on and the vector voltage of the adjustment signals is measured by vector voltmeter 400.

Next, in step 30, the signals for adjustment that have gone through one negative feedback loop are measured with negative feedback loop 810 left open. Specifically, switch 990 is turned off and switch 980 is turned on. Moreover, the vector voltage of the signals for adjustment that have gone through one negative feedback loop is measured by vector voltmeter 400.

Next, at step 40, the open-loop loss and the open-loop phase shift are calculated, the open-loop loss is compensated, and the open-loop phase shift is brought to the pre-determined value. Specifically, the ratio of the amplitude of the vector voltage and the difference in the phase angles of the vector voltage are found by comparing the vector voltage measured at step 20 and the vector voltage measured at step 30. The ratio of the amplitude of the vector voltage is the open-loop loss and the difference in the phase angles of the vector voltage is the open-loop phase shift. In order to compensate for the open-loop loss, the gain of the variable gain amplifier 941 and the gain of variable gain amplifier 942 are set by being multiplied by the inverse of the open-loop loss. Moreover, the phase of the output signals of signal source 913 and the phase of the output signals of signal source 914 are controlled in order to keep the open-loop phase shift at a pre-determined value. Negative feedback loop 810 settles most rapidly when the open-loop phase shift is 180°. In other words, the time up to when measurements start is shortened. Consequently, the phase of the output signals of signal source 913 and the phase of the output signals of signal source 914 are controlled so that the value obtained by subtracting 180° from the open-loop phase shift is desired open-loop phase shift $\phi$. By compensating for open-loop loss and controlling the open-loop phase shift as described above, the settling time of negative feedback loop 810 is uniform and can be universally shortened at all of the measurement signal frequencies, regardless of the impedance of device under test 100 that is connected, the ground capacitance of wafer interface device 700, the total ground capacitance of cable 510, and the frequency of the measurement signals, and therefore the output signal of current-to-voltage converting apparatus 800 settles rapidly. As above mentioned, control of the open-loop phase shift is performed by controlling the phase of the output signals of signal source 913 and the phase of the output signals of signal source 914. Control of the open-loop phase shift can also be performed by controlling the phase of the output signals of signal source 973 and the phase of the output signals of signal source 974.

Next, at step 50, negative feedback loop 810 is closed and the impedance of device under test 100 is measured. Specifically, switches 951 and 952 are brought to the T side and variable gain amplifier 941 and mixer 971 are connected and variable gain amplifier 942 and mixer 972 are connected, respectively. Cosine signals are output from signal source 974. Switch 980 and switch 990 are both turned off. The output signal $E_{dut}$ of buffer 550 and the output signal $E_{rr}$ of buffer 560 are measured by vector voltmeter 400. Furthermore, the vector ratio of the measured signal $E_{dut}$ and the signal $E_{rr}$ is calculated and the impedance of device under test 100 is calculated from the calculated vector ratio and the resistance of range resistor 330.

Next, at step 60, the calculated impedance is output to the display screen (not illustrated), or is output to the printer (not illustrated) that is connected to impedance measuring apparatus 20 or the like.

The above-mentioned embodiment of the present invention is only one embodiment that explains the present invention according to the Scope of the Patent Claim, and it is clear to experts in the field that a variety of modifications are possible within the claimed scope of the Scope of the Patent Claim. Finally, several embodiments of the present invention are given below, underscoring the possibility of broad application of the present invention.

A current-to-voltage converting apparatus characterized in that it is a current-to-voltage converting apparatus connected to an element or a circuit having a first terminal connected to a signal source, with this current-to-voltage converting apparatus comprising: a feedback amplifier, which is connected to a second terminal of this element or this circuit and keeps this second terminal at virtual ground, and which converts the current signals that flow to this element or this circuit to voltage signals and outputs these signals, means for opening the feedback loop of this feedback amplifier and measuring the open-loop loss of this feedback loop, and a compensating amplifier, which compensates for this open-loop loss.

The current-to-voltage converting apparatus as discussed above, characterized in that it further comprises: means for measuring the open-loop phase shift of this feedback loop when this feedback loop is open; and control means for keeping this open-loop phase shift at a pre-determined value.

When this feedback loop is open or the open-loop loss of this feedback loop is measured, the output of this signal source is controlled so that it becomes zero or a direct-current signal.

The feedback amplifier preferably comprises a modulation-type narrow-band amplifier, and this narrow-band amplifier comprises a phase sensitive detector, filters, and a vector modulator.

The compensating amplifier is placed in between the phase sensitive detector and the vector modulator.

The control means controls the phase difference between the signal that is applied to the phase sensitive detector and the signal that is applied to the vector modulator.

The feedback loop is opened by being opened in between the phase sensitive detector and the vector modulator.

The feedback amplifier further comprises a null detector and a feedback circuit, the null detector is connected to the second terminal and the signals that are input to the null detector are converted to voltage signals by the null detector, the narrow-band amplifier resolves this converted voltage signal into an in-phase component and an quadrature-phase component using the phase sensitive detector, filters this in-phase component and this quadrature-phase component using these respective filters, vector modulates this filtered in-phase component and this filtered quadrature-phase component using this vector modulator, and outputs the vector voltage signals, and the feedback circuit inputs these vector signals to the null detector.

The element or circuit is a capacitive element or capacitive circuit.

An impedance measuring apparatus which comprises: a signal source connected to a first terminal of a device under test, a feedback amplifier, which is connected to a second terminal of the device under test and keeps the second terminal at virtual ground, and which converts current signals that flow to this device under test to voltage signals and outputs these signals, means for opening the feedback loop of this feedback amplifier and measuring the open-loop loss of this feedback loop, a compensating amplifier, which compensates this open-loop loss, and means for measuring the vector voltage ratio between the voltage signals between the first terminal and the second terminal and the output signals of the feedback amplifier, wherein it measures the impedance of the device under test from this vector voltage ratio.

The impedance measuring apparatus further comprising: means for measuring the open-loop phase shift of the feedback loop when this feedback loop is open; and control means for keeping the open-loop phase shift at a pre-determined value.

The feedback loop is open or the open-loop loss of this feedback loop is measured, the output of the signal source is controlled so that it becomes zero or a direct-current signal.

The feedback amplifier comprises a modulation-type narrow-band amplifier, and this narrow-band amplifier comprises a phase sensitive detector, filters, and a vector modulator.

The compensating amplifier is placed in between the phase sensitive detector and the vector modulator.

The control means controls the phase difference between the signal that is applied to the phase sensitive detector and the signal that is applied to the vector modulator.

The feedback loop is opened by being opened in between the phase sensitive detector and the vector modulator.

The feedback amplifier further comprises a null detector and a feedback circuit, this null detector is connected to the second terminal and the signals that are input to the null detector are converted to voltage signals by the null detector, the narrow-band amplifier resolves this converted voltage signal into an in-phase component and an quadrature-phase component using the phase sensitive detector, filters this in-phase component and this quadrature-phase component using these respective filters, vector modulates this filtered in-phase component and this filtered quadrature-phase component using the vector modulator, and outputs the vector voltage signals, and the feedback circuit inputs these vector signals to the null detector.

The element or the circuit is a capacitive element or capacitive circuit.

As previously described in detail, a current-to-voltage converting apparatus connected to an element or a circuit having a first terminal connected to a signal source comprises a feedback amplifier, which is connected to a second terminal of this element or this circuit and keeps the second terminal at virtual ground, and which converts the current signals that flow to this element or this circuit to voltage signals and outputs these signals; means for opening the feedback loop of this feedback amplifier and measuring the open-loop loss of this feedback loop; and a compensating amplifier, which compensates for this open-loop loss, and therefore, the settling time of this feedback loop is shortened.

In addition, it comprises means for measuring the open-loop phase shift of the feedback loop when this feedback loop is open and control means for keeping this open-loop phase shift at a pre-determined value, and therefore, the settling time of this feedback loop is further shortened.

The result of shortening the settling time of this feedback loop is similarly obtained with the impedance measuring apparatus comprising the above-mentioned current-to-voltage converting apparatus. That is, the impedance measuring apparatus comprises a signal source connected to a first terminal of a device under test; a feedback amplifier, which is connected to a second terminal of this device under test and keeps the second terminal at virtual ground, and which converts current signals that flow to this device under test to voltage signals and outputs these signals; means for opening the feedback loop of this feedback amplifier and measuring the open-loop loss of this feedback loop; a compensating amplifier, which compensates this open-loop loss; and means for measuring the vector voltage ratio between the voltage signals between the first terminal and the second terminal and the output signals of this feedback amplifier. Therefore, the settling time of this feedback loop can be shortened and high-speed measurement is possible.

Moreover, the vector measuring apparatus comprises means for measuring the open-loop phase shift of this feedback loop when this feedback loop is open and control means for keeping this open-loop phase shift at a pre-determined value. Therefore, the settling time of this feedback loop is further shortened and measurements can be conducted more rapidly.

For instance, when the device under test is a capacitor of 10 pF and the ground capacitance of the wafer interface device is 1,000 pF or higher and the impedance of the device under test is measured at a measurement signal of 100 kHz, the measurement time of the impedance measuring apparatus of the present invention proceeds at least three times more rapidly than that of a conventional apparatus.

What is claimed is:

1. A current-to-voltage converting apparatus connected to an element or a circuit having a first terminal connected to a signal source, wherein said current-to-voltage converting apparatus comprises:
    a feedback amplifier, which is connected to a second terminal of said element or said circuit and keeps said second terminal at virtual ground, and which converts the current signals that flow to said element or said circuit to voltage signals and outputs these signals,
    means for opening the feedback loop of said feedback amplifier and measuring the open-loop loss of said feedback loop, and
    a compensating amplifier, which compensates for said open-loop loss.

2. The current-to-voltage converting apparatus according to claim 1, further comprising:
    means for measuring the open-loop phase shift of said feedback loop when said feedback loop is open; and
    control means for keeping said open-loop phase shift at a pre-determined value.

3. The current-to-voltage converting apparatus according to claim 1, wherein said feedback loop is open or the open-loop loss of said feedback loop is measured, the output of said signal source is controlled so that it becomes zero or a direct-current signal.

4. The current-to-voltage converting apparatus according to claim 1, wherein said feedback amplifier comprises a modulation-type narrow-band amplifier, and said narrow-band amplifier comprises a quadrature detector, filters, and a vector modulator.

5. The current-to-voltage converting apparatus according to claim 4, wherein said compensating amplifier is placed in between said quadrature detector and said vector modulator.

6. The current-to-voltage converting apparatus according to claim 4, wherein said control means controls the phase difference between the signal that is applied to said quadrature detector and the signal that is applied to said vector modulator.

7. The current-to-voltage converting apparatus according to claim 4, wherein said feedback loop is opened by being opened in between said quadrature detector and said vector modulator.

8. The current-to-voltage converting apparatus according to claim 4, wherein said feedback amplifier also comprises a null detector and feedback circuit, said null detector is connected to said second terminal and the signals that are input to said null detector are converted to voltage signals by the null detector, said narrow-band amplifier resolves said converted voltage signal into an in-phase component and an quadrature-phase component using said quadrature detector, filters said in-phase component and said quadrature-phase component using said respective filters, vector modulates said filtered in-phase component and said filtered quadrature-phase component using said vector modulator, and outputs the vector voltage signals, and said feedback circuit inputs said vector signals to said null detector.

9. The current-to-voltage converter apparatus according to claim 1, wherein said element or said circuit is a capacitive element or capacitive circuit.

10. An impedance measuring apparatus which comprises:

a signal source connected to a first terminal of a device under test, a feedback amplifier, which is connected to a second terminal of said device under test and keeps said second terminal at virtual ground, and which converts current signals that flow to said device under test to voltage signals and outputs these signals, means for opening the feedback loop of said feedback amplifier and measuring the open-loop loss of said feedback loop, a compensating amplifier, which compensates said open-loop loss, and means for measuring the vector voltage ratio between the voltage signals between said first terminal and said second terminal and the output signals of said feedback amplifier, whereby it measures the impedance of said device under test from said vector voltage ratio.

11. The impedance measuring apparatus according to claim 10, further comprising:

means for measuring the open-loop phase shift of said feedback loop when said feedback loop is open; and control means for keeping said open-loop phase shift at a pre-determined value.

12. The impedance measuring apparatus according to claim 10, wherein said feedback loop is open or the open-loop loss of said feedback loop is measured, the output of said signal source is controlled so that it becomes zero or a direct-current signal.

13. The impedance measuring apparatus according to claim 10, wherein said feedback amplifier comprises a modulation-type narrow-band amplifier, and said narrow-band amplifier comprises a quadrature detector, filters, and a vector modulator.

14. The impedance measuring apparatus according to claim 13, wherein said compensating amplifier is in between said quadrature detector and said vector modulator.

15. The impedance measuring apparatus according to claim 13, wherein said control means controls the phase difference between the signal that is applied to said quadrature detector and the signal that is applied to said vector modulator.

16. The impedance measuring apparatus according to claim 13, wherein said feedback loop is opened by being opened in between said quadrature detector and said vector modulator.

17. The impedance measuring apparatus according to claim 13, wherein said feedback amplifier also comprises a null detector and feedback circuit, said null detector is connected to said second terminal and the signals that are input to the null detector are converted to voltage signals by the null detector, said narrow-band amplifier resolves said converted voltage signal into an in-phase component and an quadrature-phase component using said quadrature detector, filters said in-phase component and said quadrature-phase component using said respective filters, vector modulates said filtered in-phase component and said filtered quadrature-phase component using said vector modulator, and outputs the vector voltage signals, and said feedback circuit inputs said vector signals to said null detector.

18. The impedance measuring apparatus in claim 10, wherein said element or said circuit is a capacitive element or capacitive circuit.

* * * * *